United States Patent [19]
Watarai

[11] Patent Number: 6,052,018
[45] Date of Patent: Apr. 18, 2000

[54] SMALL AMPLITUDE SIGNAL OUTPUT CIRCUIT

[75] Inventor: Seiichi Watarai, Tokyo, Japan

[73] Assignee: NEC Corporation, Tokyo, Japan

[21] Appl. No.: 09/096,169

[22] Filed: Jun. 12, 1998

[30] Foreign Application Priority Data

Jun. 13, 1997 [JP] Japan ................................ 9-156519

[51] Int. Cl.⁷ .............................. H03K 3/353; G05F 3/02
[52] U.S. Cl. ........................ 327/433; 327/112; 327/331; 327/543; 326/34; 326/81; 326/83; 326/84
[58] Field of Search ..................................... 327/309, 331, 327/332, 362, 433, 512, 513, 112, 374, 538, 542, 543; 326/80, 81, 83, 84, 86, 31, 32, 33, 34; 323/907

[56] References Cited

U.S. PATENT DOCUMENTS

| | | | |
|---|---|---|---|
| 5,172,015 | 12/1992 | Barre ........................................ | 326/66 |
| 5,334,882 | 8/1994 | Ting ......................................... | 326/86 |
| 5,378,943 | 1/1995 | Dennard ................................... | 329/68 |
| 5,550,487 | 8/1996 | Lyon ........................................ | 326/33 |

OTHER PUBLICATIONS

Patent Abstracts of Japan, vol. 014, No. 448 (E–0983), JP 02 177724 (Jul. 10, 1990).
Patent Abstracts of Japan, vol. 014, No. 082 (E–0889), JP 01 295508 (Nov. 29, 1989).

*Primary Examiner*—Toan Tran
*Assistant Examiner*—Terry L. Englund
*Attorney, Agent, or Firm*—Foley & Lardner

[57] ABSTRACT

A small amplitude signal output circuit comprises an output section for receiving a logic signal to output a small amplitude signal, a level sense circuit for sensing the rise or fall of an output voltage at an output terminal, and a level control circuit for responding to the output of the level sense circuit to suppress the rise or fall of the output voltage. The output circuit suppresses voltage variations caused by variations in fabrication process of transistors, ambient temperature and source voltage noise.

14 Claims, 7 Drawing Sheets

SMALL AMPLITUDE SIGNAL OUTPUT CIRCUIT

BACKGROUND OF THE INVENTION

1. Field of the Invention

The present invention relates to a small amplitude signal output circuit and, more particularly, to a small amplitude signal output circuit transmitting logic signals between integrated circuits by way of a transmission line.

2. Description of the Related Art

Some output circuits are used as signal transmission means for transmitting signals between two or more integrated circuits via transmission paths such as bus lines. When a logic signal is to be transmitted from an output circuit, the logic signal assumes either H-level or L-level of logical value. Accordingly, there essentially exist in an output circuit of an integrated circuit, an input terminal for receiving internal logic signals from the internal circuit of the integrated circuit, and an output terminal for delivering the internal logic signals to another integrated circuit.

Although most conventional transmission signals have an amplitude close to the power source potential supplied to tie integrated circuit, the signal amplitude has been reduced for transmission in recent years. For instance, in case of a CMOS interface for a conventional transmission signal, the signal amplitude was substantially equal to the power source potential such as about 5V or about 3V. On the other hand, the recent transmission signal having a small amplitude, such as used in a low voltage differential signaling (LVDS) interface, the signal amplitude is as low as about 0.3V. The reason for reduction of the signal amplitude is that the reduction achieves great advantages in higher transmission speed, lower power dissipation, and smaller noise during signal transmission. Accordingly, it is requested that integrated circuits for achieving a higher speed and/or lower power dissipation as the primary objects thereof have an output circuit capable of outputting lower amplitude signals. As a means for outputting the low amplitude signals, some proposals have been offered, and the following is an example thereof.

With reference to FIG. 1 showing a circuit diagram of Pseudo Emitter Coupled Logic interface (PECL interface) as a first conventional output circuit, which is a typical example of a low amplitude interface, the output circuit comprises: a PMOS transistor M11 having a source connected to source line VDD of positive potential, a drain connected to output terminal OUT1 which outputs a low amplitude signal and a gate connected to input terminal IN1; an NMOS transistor M12 having a drain connected to the drain of transistor M11, a gate connected to the gate of transistor M11, and a source connected to source line VSS of ground potential; and a terminal resistor RTT1, having a first terminal connected to output terminal OUT1 and a second terminal connected to a terminal power source VTT.

In general, positive potential is supplied from outside the integrated circuit to source line VDD and source line VSS is grounded. In other cases, source line VDD is grounded, and a negative potential is supplied to source line VSS.

The values of terminal resistor RTT1 and terminal power source potential VTT are generally specified in a standard wherein the former is about 50Ω, and the latter is obtained by subtracting about 2V from the power source potential VDD.

In operation, when a potential at H-level which is close to potential VDD of source line VDD is supplied to input terminal IN1, transistor M11 is OFF and transistor M12 is ON. Thus, a current path is formed from terminal power source VTT to source line VSS via terminal resistor RTT1 and transistor M12. L-level potential VOL of output terminal OUT1 at this stage is expressed by:

$$VOL=VTT-\{(VTT-VSS) \times RTT\}/(RTT+RONN) \quad (1),$$

wherein VTT, VSS, RTT and RONN represent potential of power source VTT, potential of source line VSS, resistance of resistor RTT1 and ON-resistance of NMOS transistor M12, respectively.

When potential at L-level which is close to potential VSS of source line VSS is supplied to input terminal IN, transistor M11 is ON and transistor M12 is OFF. Thus a current path is formed from source line VDD to terminal source VTT via transistor M11 and terminal resistor RTT1. Potential VOH at H-level of output terminal OUT1 at this stage is expressed by:

$$VOH=VTT+\{(VDD-VTT) \times RTT\}/(RTT+RONP) \quad (2),$$

wherein RONP represents ON-resistance of PMOS transistor M11.

To calculate practical values for H-level VOH and L-level VOL of output OUT1 and relative output signal amplitude (VOH−VOL), each variable in expressions, or formulas, (1) and (2) is set as follows: VDD=3V, VSS=0V, VTT=1.5V, RTT=50Ω, RONN=200Ω, RONP=200 Ω.

After the above values are substituted for the variables in expressions (1) and (2), H-level VOH and L-level VOL of output OUT are calculated as follows:

$$VOH=1.8V \quad (3)$$

$$VOL=1.2V \quad (4).$$

Thus, the output signal amplitude is calculated as follows:

$$VOH-VOL=0.6V \quad (5)$$

The conventional output circuit has a feature that it enables to obtain a desired small signal amplitude by selecting ON-resistances RONP and RONN, which are adjusted based on the size of the transistor elements in the integrated circuit, depending on the power source potentials VDD, VSS, VTT, and terminal resistor RTT which are specified in advance.

Since the first conventional output circuit has a singe output terminal for transmission of a single signal it is generally called a single phase transmission system.

As another transmission system having a low signal amplitude interface, so-called differential transmission system is also used which outputs a pair of transmission signals from respective output terminals. The pair of transmission signals in the differential transmission system have a feature that the phase of the pair of signals are reversed from each other and have equal potentials of H-level and L-level. The reversed phase scheme in the differential transmission system provides twice the dynamic range compared to the single phase transmission system. In addition, there is an advantage that the influence by noise in the power source potential and interference by electromagnetic induction are reduced. In view of this advantage, the differential transmission system is used for a high-speed and high-reliability transmission. Some proposals have been made for the output circuit delivering differential signals in the differential transmission system, and following is an example thereof.

FIG. 2 shows a second conventional output circuit for LVDS interface as a typical differential transmission system, wherein similar constituent elements are designated by reference symbols similar to those used in FIG. 1. The output circuit comprises: a first output section 11 having transistors M11 and M12, terminal resistor RTT1, input terminal IN1 and output terminal OUT1, which are common to the first conventional output circuit; and a second output section 12 having constituent elements similar to those in the first output section 11. Specifically, the second output section 12 comprises PMOS transistor M21 having a source connected to positive potential source line VDD, a drain connected to output terminal OUT2 and a gate connected to input terminal IN2, NMOS transistor M22 having a drain connected to the drain of transistor M21, a gate connected to the gate of transistor M21, and a source connected to grounded potential source line VSS, terminal resistor RTT2 having a first terminal connected to output OUT2 and a second terminal connected to terminal source VTT.

The values for terminal resistors RTT1 and RTT2, and terminal power supply voltage VTT are generally specified in a standard, wherein RTT1 and RTT2 are set at about 45 to 65Ω and VTT is set at about 1.1V to 1.4V.

In operation, when H-level potential which is close to potential VDD of source line VDD is supplied to input terminal IN1, and at the same time, L-level potential which is close to potential VSS of source line VSS is supplied to input terminal IN2, transistors M12 and M21 are ON, transistors M11 and M22 are OFF. Thus, a current path is formed from source line VDD to terminal source VTT via transistor M21 and terminal resistor RTT2, and another current path is formed from terminal source VTT to source line VSS via terminal resistor RTT1 and transistor M12. Accordingly, output terminal OUT1 supplies an L-level signal and output terminal OUT2 supplies an H-level signal. H-level signal potential VOH and L-level signal potential VOL are given by the expressions (1) and (2) as mentioned before.

When L-level potential close to potential VSS of source line VSS is supplied to input terminal IN1, and at the same time, H-level potential which is close to potential VDD of source line VDD is supplied to input terminal IN2, transistors M11 and M22 are ON, transistors M12 and M21 are OFF. Thus, a current path is formed from source line VDD to terminal source VTT via transistor M11 and terminal resistor RTT1, and another current path is formed from terminal source VTT to source line VSS via terminal resistor RTT2 and transistor M22. Accordingly, output terminal OUT1 supplies a H-level signal and output terminal OUT2 supplies a L-level signal.

As mentioned above, the technique for generating H-level and L-level for the output signal potential in the second conventional output circuit of the differential output system is similar to the case of the first conventional output circuit of the single phase system. Thus, if the variables in the expressions (1) and (2) are the same for both the circuits, H-level signal VOH and L-level signal VOL are equal to the above-mentioned numerical values (3), (4) and (5). It is possible to obtain desired small amplitude signal in the second conventional output circuit, similarly to the first conventional output circuit, by selecting ON-resistances RONP of PMOS transistors M11 and M21 or RONN of NMOS transistors M12 and M22, which are controlled based on the size of transistor elements in the integrated circuit depending on the power source potentials VDD, VSS and VTT, and terminal resistors RTT1 and RTT2 specified in advance.

Although both the conventional output circuits have advantages as described above, there is a problem that the variation in the output signal amplitude is considerably large.

In addition, the following three factors cause variations in the ON-resistances RONP and RONN, based on which H-level voltage VOH and L-level voltage VOL of the output signal of the first conventional output circuit are controlled.

The first factor is the influence by variations in the fabrication process of the MOS transistors. The fabrication process involves variation factors which affect shape variations in the resistor elements which constitute the output circuit. For example, variations in ON-resistance of the MOS transistor range generally about ±10% to ±20% depending on the shape of the transistor.

The second factor is the influence by the ambient temperatures at which the electronic device equipped with the integrated circuit is used under various environments. The ON-resistance of the MOS transistor changes, especially with the change of the ambient temperature: for example, the variations generally range about ±8% to ±16% with respect to a temperature rage of 100° C.

The third factor is the influence by the variations in the power source potential. The power source potential supplied from outside the integrated circuit changes due to the potential loss on the source line in addition to the potential change of the external power source itself. The ON-resistance of the MOS transistor changes with the change of the input voltage: for example, the variations generally range about ±10% to ±15% with respect to a power source potential change of ±10%.

Thus, the variations in the ON-resistance of the MOS transistor generally range about ±28% to 51% when taking into account all the three factors mentioned above. The variations caused by the three factors generate variations of H-level VOH, L-level VOL and signal amplitude as follows:

$$VOH = 1.713V \text{ to } 2.007V \quad (6)$$

$$VOL = 0.993V \text{ to } 1.287V \quad (7)$$

$$VOH-VOL = 0.426V \text{ to } 1.014V \quad (8)$$

The variations in the signal amplitude VOH–VOL are 1.7 times greater than the case in which the signal amplitude is calculated from the ON-resistance of the MOS transistor when the three factors are not taken into account, namely 0.6V as shown in expression (3). Variations in the output signal amplitude, especially in the case of variations in the higher direction, reduce and cancel the advantages of the small amplitude transmission described before.

In summary, the first and the second conventional output circuits have a problem of large variations in the signal amplitude to be solved, which cause reduction in transmission speed, increase in power dissipation and increase in the noise during signal transmission.

SUMMARY OF THE INVENTION

It is therefore an object of the present invention to provide an output circuit capable of suppressing the variations in the output signal amplitude, reduction of transmission speed, and increase in electric power dissipation and in the noise during signal transmission.

The present invention provides a small amplitude signal output circuit comprising:

a first output section for receiving a first logic signal to output a first output signal through a first output terminal:

a first level sense circuit for sensing a change of a first output voltage of the fist output terminal to output a first level change signal based on the change of the first output voltage; and a level control circuit for responding to the first level change signal to suppress the change of the first output voltage in an amount corresponding to the change of the first output voltage.

In accordance with the present invention, variations in the signal amplitude of an output signal supplied from the output circuit can be suppressed by the feedback function of the first level sense circuit and the level control circuit, thereby suppressing reduction in transmission speed, increase in power dissipation and increase in the noise during signal transmission.

The above and other objects, features and advantages of the present invention will be more apparent from the following description, referring to the accompanying drawings.

PREFERRED EMBODIMENTS OF THE INVENTION

Figure 1:
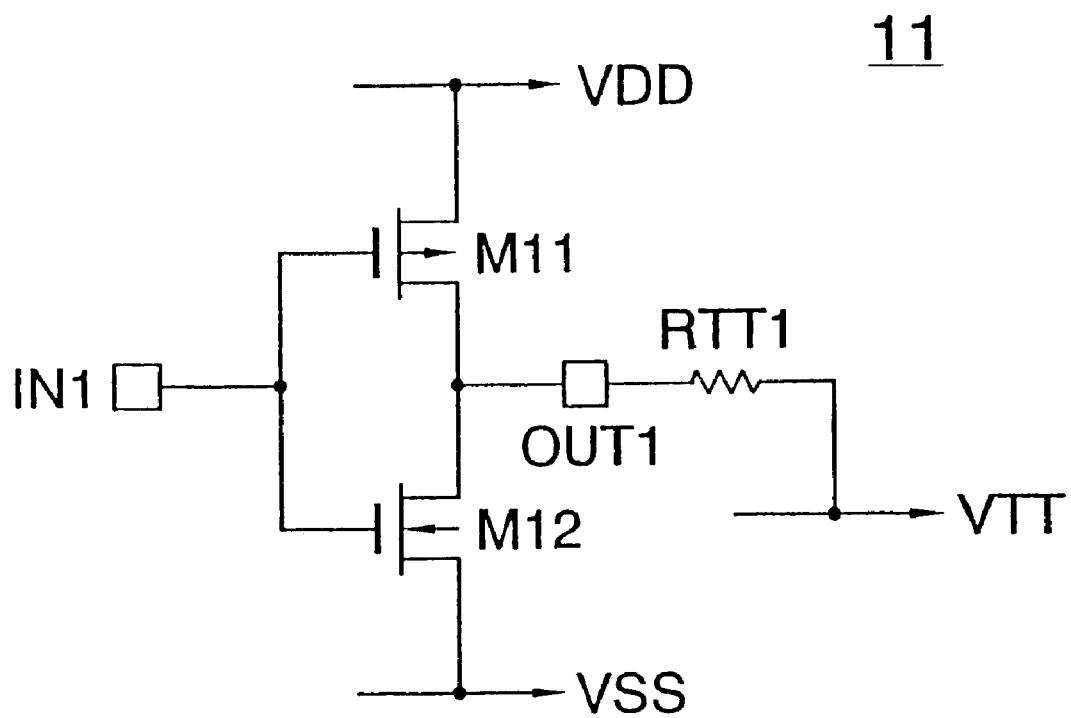
FIG. 1 is a circuit diagram of a first conventional output circuit.
Figure 2:
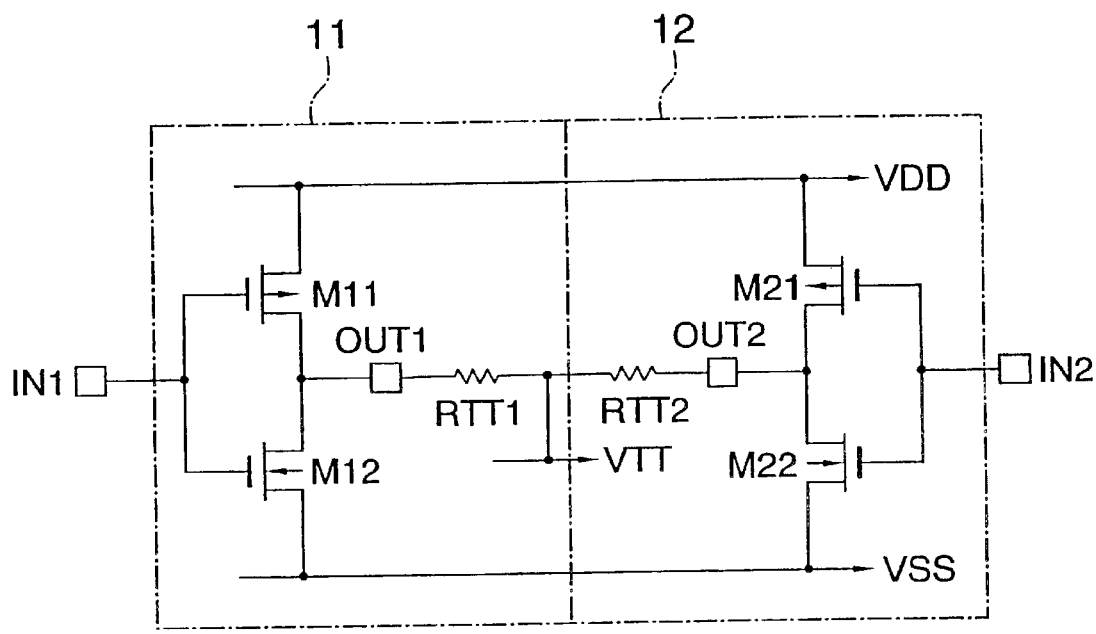
FIG. 2 is a circuit diagram of a second conventional output circuit.

Now, the present invention is more specifically described with reference to accompanying drawings, wherein similar constituent elements are designated by the same or similar reference numerals throughout the drawings.

Figure 3:
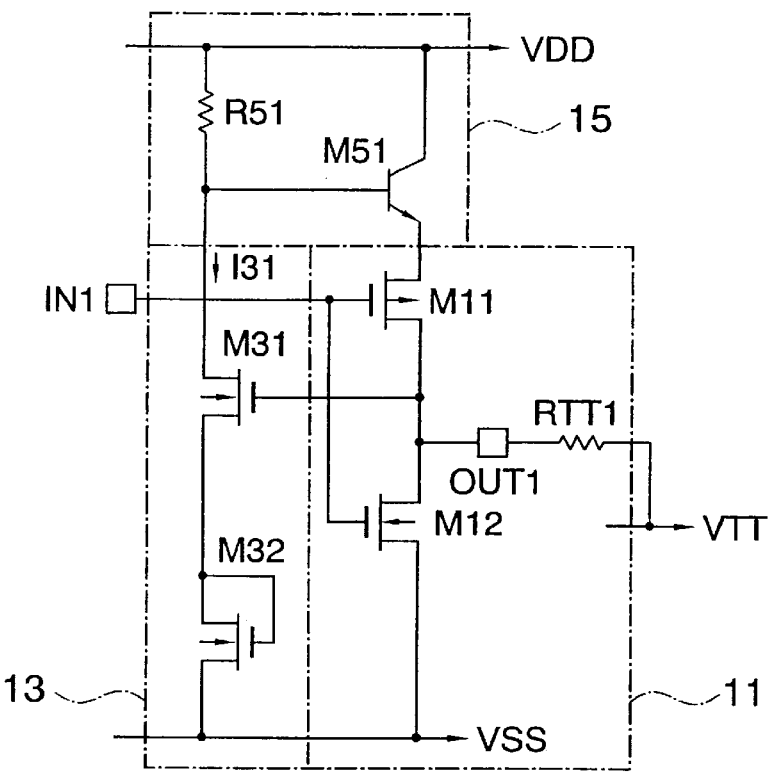
FIG. 3 is a circuit diagram of an output circuit according to a first embodiment of the present invention.

Referring to FIG. 3 showing a circuit diagram of an output circuit according to a first embodiment of the present invention, the output circuit comprises an output section 11 having PMOS transistors M11 and M12, a terminal resistor RTT1, an input terminal IN1 and an output terminal OUT1, which are similar to those in the first conventional output circuit. In addition, the output circuit comprises a level sense circuit 13 for detecting variations in the voltage level of output terminal OUT1, and a level control circuit 15 for controlling output voltage level by responding to tie variations in the voltage level detected by level sense circuit 13.

Level sense circuit 13 comprises an NMOS transistor M31 having a gate connected to output terminal OUT1 and an NMOS transistor M32 having a gate and a drain connected together, for a diode connection, to the source of transistor M31 and a source connected to power source line VSS.

Level control circuit 15 comprises: an NPN bipolar transistor M51 having a collector connected to source line VDD, a base connected to the drain of transistor M31 in level sense circuit 13 and an emitter connected to the source of transistor M11 in output section 11; and a resistor R51 having a first terminal connected to the base of transistor M51 and a second terminal connected to source line VDD.

In operation, the output circuit suppresses the variations in H-level voltage VOH of the output signal thereof. Specifically, when an L-level signal having a potential close to the potential of source line VSS is supplied to input terminal IN, transistor M11 and M12 of output circuit 11 are ON and OFF, respectively, transistor M51 of level control circuit 15 is ON. Thus, a current path is formed from source line VDD to terminal source line VTT via transistor M51, transistor M11 and terminal resistor RTT1. H-level voltage VOH of the output terminal at this stage is expressed by:

$$VOH=VTT+\{(VDD-VTT)\times RTT\}/(RTT+RONB+RONP) \quad (9),$$

wherein RONB represents ON-resistance of transistor M51.

Assuming that ON-resistance RONP of transistor M11 varies to a smaller value by the influence of the three factors mentioned before, that is, variations in fabrication process, ambient temperature and/or power source potential, to raise H-level VOH of output signal, transistors M31 and M32 of level sense circuit 13 increase ON-current flowing from the drain of transistor M31 to source line VSS via transistor M32. The current at this stage is a continuous current which changes based on the change of H-level VOH of output signal and expressed by:

$$I31=0.5\times\mu\times CO\times W/L\times(VGS-VTN31)^2 \quad (10),$$

wherein I31, $\mu$, CO, W, L, VGS and VTN31 represent current flowing through transistor M31, the carrier mobility of transistor M31, capacitance per unit area between the gate and the channel of transistor M31, gate width of transistor M31, gate length of transistor M31, gate-source voltage of transistor M31 and threshold voltage of transistor M31, respectively.

The continuous current I31 generates a voltage drop across resistor R51 of level control circuit 15 which functions as a current/voltage converter. The voltage drop VR51 appearing across resistor R51 is supplied to the base of transistor M51 which functions as the output level controller and is expressed by:

$$VR51=I31\times R51 \quad (11),$$

wherein R51 represents the resistance of resistor R51.

The increase in the current flowing through transistor M31 lowers the base-emitter voltage of transistor M51 of level control circuit 15, which supplies the voltage fall to the source of transistor M11 of output circuit 11. ON-resistance RONP11 of transistor M11 is expressed by:

$$RONP11=1/\{\mu\times CO\times W/L\times(VGS-VTP11)\} \quad (12),$$

wherein VTP11 represents the threshold voltage of transistor M11. In this case, source potential of transistor M11 falls to raise the ON-resistance RONP11 of resistor M11, thereby canceling the initial decrease of the ON-resistance of transistor M11 to maintain the H-level voltage VOH at a design value, as understood from equation (2).

Thus, even if ON-resistance RONP of transistor M11 decreases due to variations caused by the three factors, it is possible to suppress the rise of H-level voltage VOH of the output signal due to the feedback function of the output circuit. In addition, it is possible to control the H-level voltage VOH by selecting the current change factor in level sense circuit 13 and the voltage conversion coefficients in current/voltage converter of level control circuit 15 to desired values. Specifically, the control of the current change factor is easily achieved by changing the width (W) and/or the length (L) of the gate of transistor M31, and the control of the voltage conversion coefficient is easily achieved by changing the resistance of resistor R51.

Figure 4:
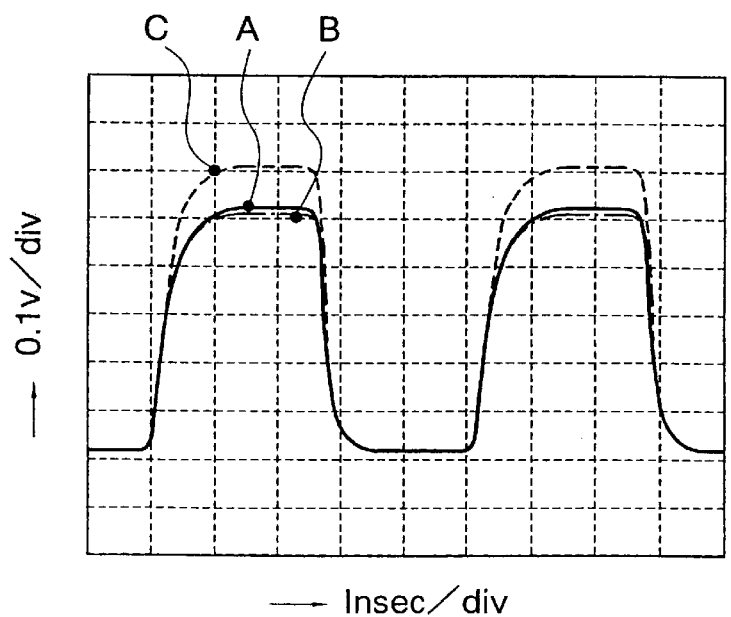
FIG. 4 is a signal timing chart of the output circuit of FIG. 3 and the conventional output circuit.

Referring to a signal timing chart of FIG. 4 obtained by a simulation, wherein waveform "A" of output terminal OUT1 in the present embodiment when the three factors in transistor M11 are taken into account is shown in comparison with ideal waveform "B", namely, when the three factors are not taken into account, and waveform "C" of the first conventional output circuit when the three factors are taken into account. As shown in the chart, H-level VOH of the output signal rises about 43% by the influence of the three factors in waveform "C" of the first conventional output circuit, whereas the rise of H-level VOH of the output signal is suppressed down to 7% in waveform "A" of the present embodiment.

Figure 5:
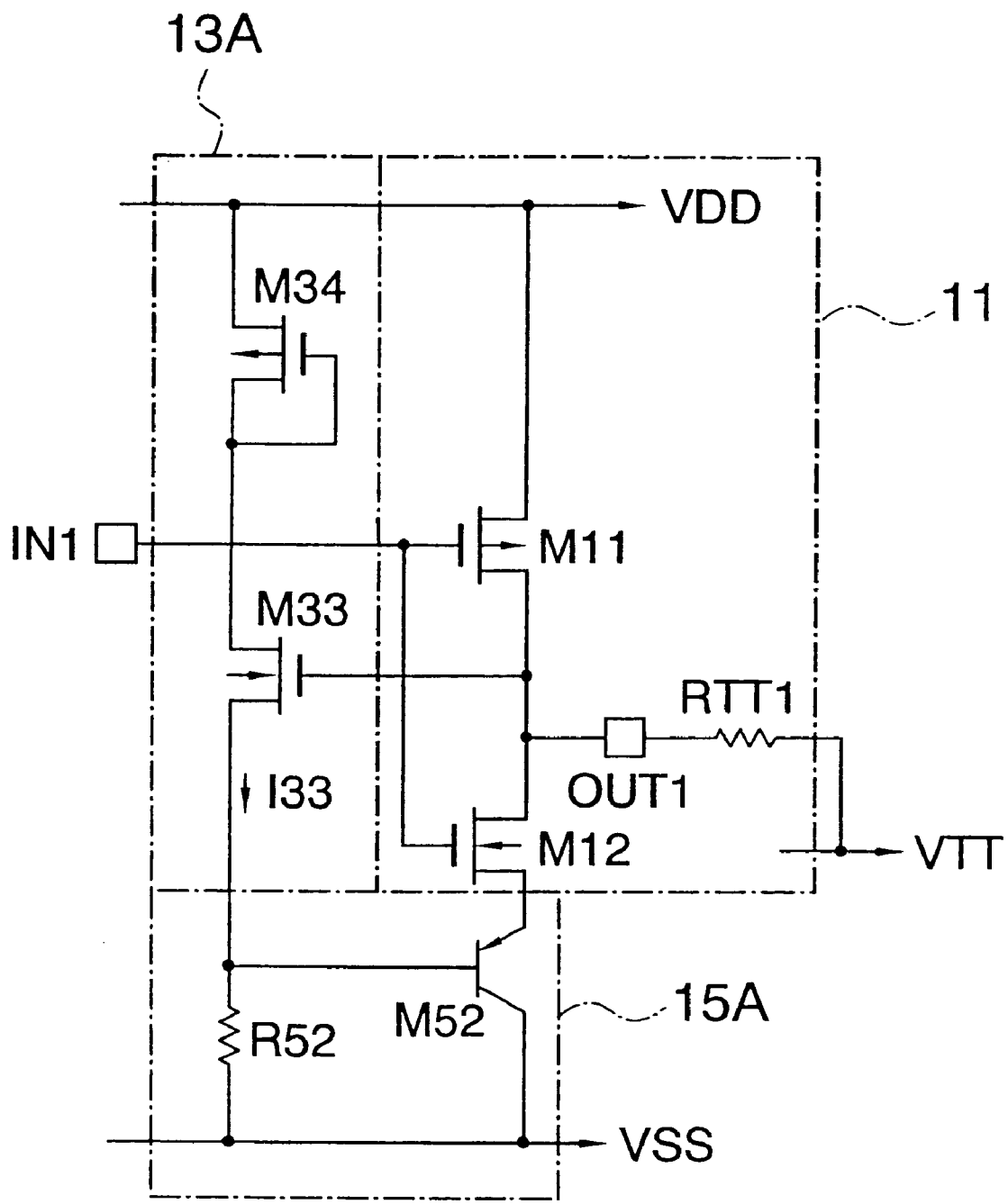
FIG. 5 is a circuit diagram of an output circuit according to a second embodiment of the present invention.

Referring to FIG. 5 showing a circuit diagram of an output circuit according to a second embodiment of the present invention, the output circuit of the present embodiment is similar to the first embodiment except that the output circuit comprises: a level sense circuit 13A, instead of level sense circuit 13 of FIG. 3, including PMOS transistor M33 having a gate connected to output terminal OUT1, a PMOS transistor M34 having a drain and a gate connected together, for a diode connection, to the drain of transistor M33 and a source connected to power source VDD; and a level control circuit 15A, instead of level control circuit 15 of FIG. 3, having a PNP bipolar transistor M52 having a collector, a base and an emitter which are connected to power source VSS, the source of transistor M33 of level sense circuit 13A and the source of transistor M12 of output portion 11, respectively, and a resistor R52 having a first terminal connected the base of transistor M52 and a second terminal connected to source line VSS.

In operation the output circuit of the present embodiment suppresses the variations in L-level VOL of the output signal thereof. Specifically, when an H-level signal having a potential close to source line VDD is supplied to input terminal IN, transistors M11 and M12 of output circuit 11 are OFF and ON, respectively, and transistor M52 of level control circuit 15A is ON. Thus, a current path is formed from source line VTT to source line VSS via transistor 52, transistor M12 and terminal resistor RTT1. L-level VOL of the output terminal at this stage is expressed by:

$$VOL=VTT-\{(VTT-VSS)-RTT\}/(RTT+RONC+RONN) \quad (13)$$

wherein RONC represents ON-resistance of transistor M52.

Similarly to the first embodiment, when ON-resistance RONN of transistor M12 varies to a lower value due to the influence of the three factors to decrease L-level voltage VOL of the output signal, transistors M33 and M34 of the level sense circuit 13A increase ON-current flowing from source line VDD through the drain of transistor M33 toward the drain of transistor M34 of level sense circuit 13A. Assuming that the carrier mobility of transistor M33, gate width gate length, capacitance per unit area between the gate and the channel, gate-source voltage, and threshold voltage of transistor M33 are represented by $\mu$, W, L, CO, VGS and VTP33, respectively, current I33 at this stage is a continuous current which changes based on the change of L-level VOL of the output signal, and is expressed by:

$$I33=0.5\times\mu\times CO\times W/L\times (VGS-VTP33)^2 \quad (14).$$

The current I33 flowing from the drain of transistor M33 to source line VSS via resistor R52 of level control circuit 15A increases due to the decrease of the output voltage VOL. A continuous potential drop generated across resistor R52 is supplied to the base of transistor M52, and the collector-base voltage VR52 is expressed by:

$$VR52=I33\times R52 \quad (15),$$

wherein R52 represents the resistance of resistor R52.

The increase of current I33 increases the base voltage of transistor M52 of level control circuit 15A, which increase the emitter voltage of transistor M52 to raise the source potential of transistor M12. ON-resistance RONN12 of transistor M12 is expressed by:

$$RONN12=1/\{\mu\times CO\times W/L\times (VGS-VTN12)\} \quad (16),$$

wherein VTN12 represents the threshold voltage of transistor M12.

In this case, the rise of the source potential of transistor M12 lowers the gate-source voltage VGS. As a result, as understood from expression (16), ON-resistance RONN12 of transistor M12 rises to cancel the initial decrease of the ON-resistance. In addition, as understood from expression (1), the rise of ON-resistance RONN12 of transistor M12 raises L-level VOL of the output signal.

Thus, even if ON-resistance RONN12 of transistor M12 decreases, it is possible to suppress the fall of L-level voltage VOL of the output signal due to the feedback function of the output circuit. In addition, it is possible to control L-level VOL by selecting the current change factor in the level sense circuit 13A and the voltage conversion coefficients by the current/voltage converter of level control circuit 15A to desired values. Specifically, the control of the current change factor is easily achieved by changing the width and/or the length of the gate of transistor M33, and the control of the voltage conversion coefficient is easily achieved by changing the resistance of resistor R52.

Figure 6:
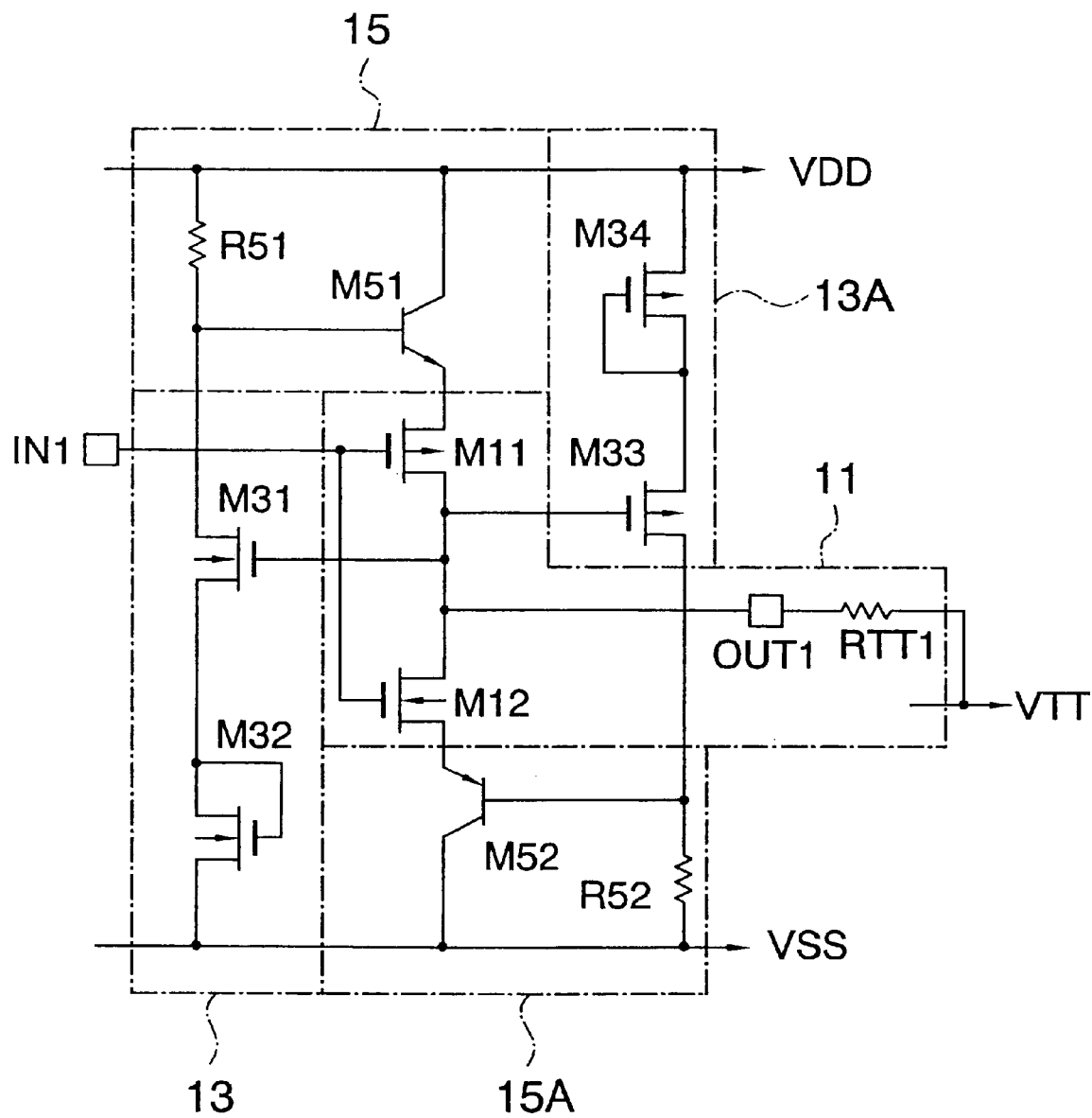
FIG. 6 is a circuit diagram of an output circuit according to a third embodiment of the present invention.

Referring to FIG. 6 showing a circuit diagram of an output circuit according to a third embodiment of the present invention, the output circuit of the present invention comprises the constituent elements of both the first embodiment and the second embodiment. Specifically, the output circuit of the present embodiment comprises an output section 11, having transistors M11 and M12, for responding to an input supplied through an input terminal IN1 to deliver an output signal from an output terminal OUT1, a level sense circuit 13, having transistors M31 and M32, for sensing the output voltage at OUT1, a level sense circuit 13A, having transistors M33 and M34, for sensing the output voltage at OUT1, a level control circuit 15, having transistors M51 and resistor R51, for responding to the current of level sense circuit 13, and a level control circuit 15A, having transistors M52 and resistor R52, for responding to the current of level sense circuit 13A.

In operation, the output circuit of the present embodiment suppresses the variations in both H-level voltage VOH and L-level voltage VOL of the output signal. Specifically, when L-level signal having a potential close to source line VSS is supplied to input terminal IN, an operation similar to the first embodiment is effected to suppress the change of H-level VOH of the output signal by the function of level sense circuit 13 and level control circuit 15. In addition, when H-level signal having a potential close to source line VDD is supplied to input terminal IN, an operation similar to the second embodiment is effected to suppress the change of L-level VOL of the output signal by the function of level sense circuit 13A and level control circuit 15A.

Figure 7:
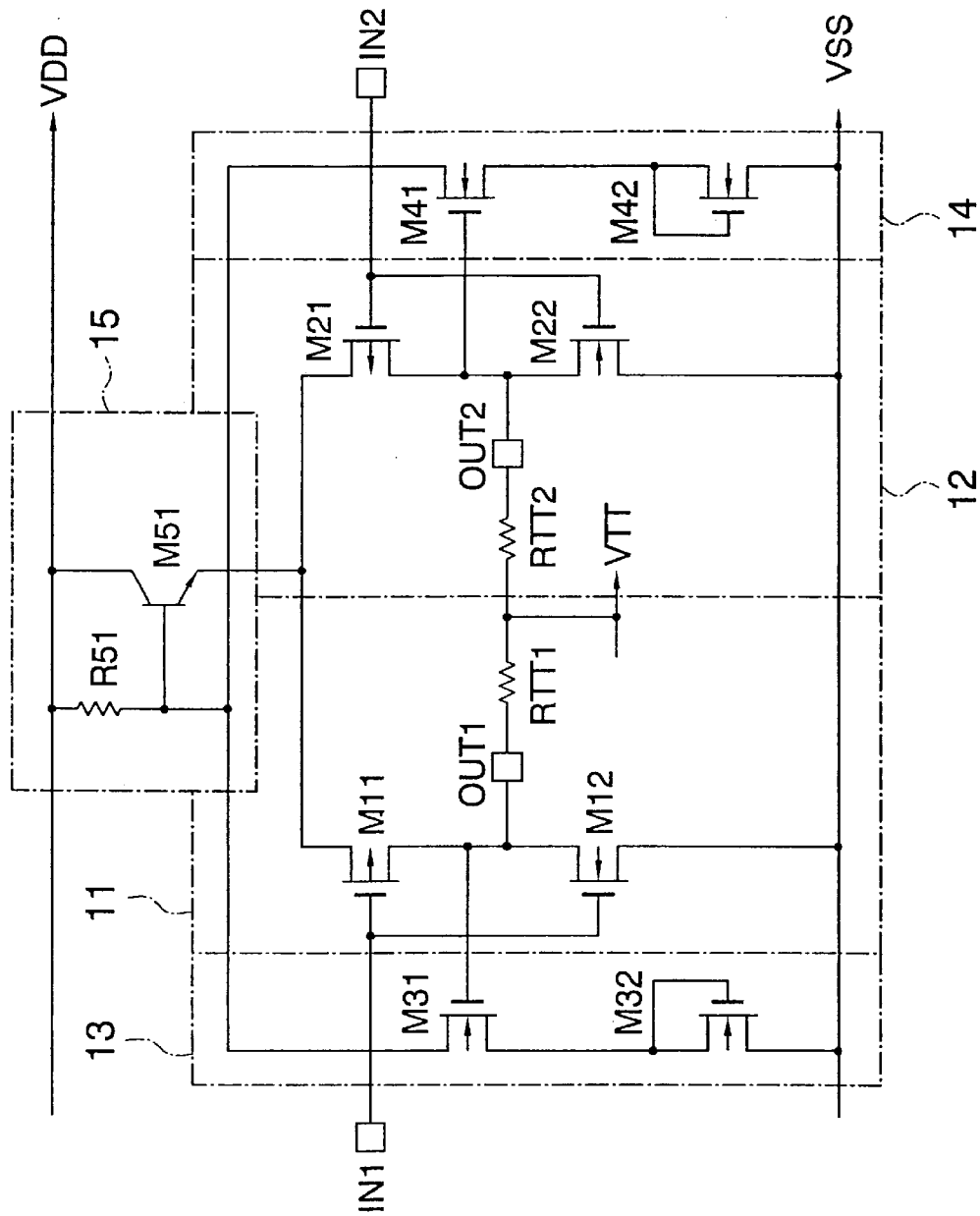
FIG. 7 is a circuit diagram of an output circuit according to a fourth embodiment of the present invention.

Referring to FIG. 7 showing a circuit diagram of an output circuit according to a fourth embodiment of the present invention, the configuration shown in the first embodiment is applied to a differential transmission system in the present embodiment. The output circuit of the present embodiment comprises, in addition to the constituent elements (output section 11, level sense circuit 13 and level control circuit 15) of the first embodiment, an output section 12 having a PMOS transistor M21 having a source connected to source line VDD of positive potential, a drain connected to output terminal OUT2, and a gate connected to input terminal IN2, an NMOS transistor M22 having a drain connected to the drain of transistor M21, a gate connected to the gate of transistor M21, and a source connected to source line VSS of ground potential, and a terminal resistor RTT2 having a first terminal connected to output terminal OUT2 and a second terminal connected to terminal source VTT; and a level sense circuit 14 having an NMOS transistor M41 having a drain connected to the base of transistor M51 of level control circuit 15 and a gate connected to output terminal OUT2, and an NMOS transistor M42 having a drain and a gate connected together to the source of transistor M41 and a source connected to source line VSS.

As noted, the output circuit of the present embodiment, implemented as a differential transmission system, comprises a pair of input terminals IN1 and IN2, and a pair of output terminals OUT1 and OUT2. In this configuration, output section 11 connected to a pair of input terminal IN1 and output terminal OUT1, level sense circuit 13 and level control circuit 15 are similar to those in the first embodiment implemented as a single phase transmission system. Output section 12 connected to a pair of input terminal IN2 and output terminal OUT2, and level sense circuit 14 are also similar to those shown in FIG. 3.

Accordingly, the operation and the advantages in the present embodiment are similar to those in the first embodiment as to output sections 11 and 12, level sense circuits 13 and 14 and level control circuit 15. It is to be noted that a single level control circuit 15 is provided herein in view of simplification of the output circuit. It is possible, however, to provide a pair of level control circuits in the present embodiment, although operation and advantages improve little from the single level control circuit 15.

Figure 8:
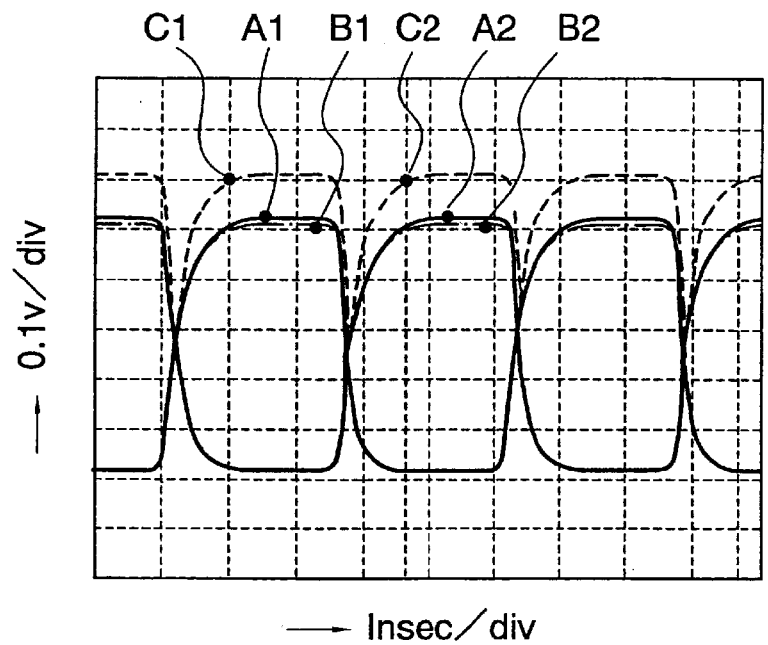
FIG. 8 is a signal timing chart of the output circuit of FIG. 7.

FIG. 8 is a signal timing chart obtained by a simulation for the present embodiment, showing waveforms "A1" and "A2" of respective output terminals OUT1 and OUT2 in the present embodiment when the three factors in transistors M11 and M21 are taken into account in comparison with ideal waveforms "B1" and "B2" when the three factors are not taken into account, and waveforms "C1" and "C2" of the second conventional output circuit when the three factors are taken into account. As shown in the chart, H-level VOH of the output signal rises about 43% due to the influence by the three factors in waveforms "C1" and "C2" of the second conventional output circuit, whereas, the variation of H-level VOH of the output signal is suppressed by 7% in waveforms "A1" and "A2" of the present embodiment. This is similar to FIG. 4 shown for the single phase transmission system of the first embodiment. Thus, the output circuit of the present invention may be applied to both the single phase transmission system and the differential transmission system.

In the present embodiment, the configuration of the first embodiment is applied to the differential transmission system. It is also possible to apply the configurations of the second and third embodiment to the differential transmission system.

In the above embodiments, it is described that the sense transistor of level sense circuit is implemented by NMOS/PMOS transistor. It is also possible to implement the sense transistor of level sense circuit by NPN/PNP bipolar transistor.

In addition, the current/voltage converter of the level control circuit is implemented by a resistor; however, it is also possible to implement the resistor element by a PMOS/NMOS transistor or PNP/NPN bipolar transistor. It is also possible that the level control transistor of the level control circuit is implemented by a NMOS/PMOS transistor instead of the NPN/PNP bipolar transistor.

Figure 9:
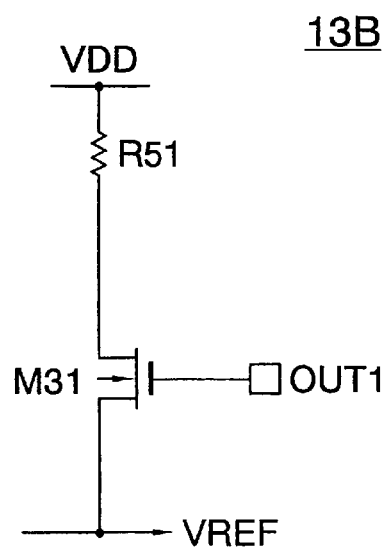
FIG. 9 is a circuit diagram of a level sense circuit modified from level sense circuit shown in FIG. 3.

Referring to FIG. 9 showing a level sense circuit 13B modified from level sense circuit 13 of FIG. 3, level sense circuit 13B comprises a transistor M31 having a source supplied with a reference voltage VREF instead of providing transistor M32 having a diode connection. Transistor M31 is similar to that shown in FIG. 3.

It is to be noted that level sense circuit 13 of FIG. 3 converts variations in H-level VOH of the output signal into continuous current change 133 as shown in expression (10). On the other hand, in level sense circuit 13B of FIG. 9, the gate-source potential VGS of transistor M31 is controlled at a desired value by controlling the reference voltage VREF. This configuration provides an additional advantage that a more accurate output voltage can be sensed.

Since the above embodiments are described only for examples, the present invention is not limited to the above embodiments and various modifications or alterations can be easily made therefrom by those skilled in the art without departing from the scope of the present invention.

What is claimed is:

1. A small amplitude signal output circuit comprising:
    a first output section for receiving a first logic signal to output a first output signal having a first output voltage through a first output terminal;
    a first level sense circuit for producing a first level signal based on the first output voltage such that, as the first output voltage changes, the first level signal changes by a corresponding amount; and
    a first level control circuit for varying the first output voltage based on the change in the first level signal,
    wherein said first output section comprises a pair of first and second transistors connected in series, drain regions of said transistors being connected to said first output terminal and to a terminal voltage source through a resistor and said first output terminal,
    wherein said first level sense circuit comprises a third transistor having a gate connected to said first output terminal and a fourth transistor connected in series with said third transistor, and
    wherein said first level control circuit comprises a resistor element connected in series with said third and fourth transistors, and a fifth transistor having an emitter connected to a source of said first transistor and a base connected to a drain of said third transistor.

2. A small amplitude signal output circuit as defined in claim 1, wherein said first level sense circuit increases the first level signal in response to a rise in the first output voltage.

3. A small amplitude signal output circuit as defined in claim 1, wherein said first level sense circuit decreases the first level signal in response to a fall in the first output voltage.

4. A small amplitude signal output circuit as defined in claim 1, further comprising:
    a second level sense circuit for producing a second level signal based on the first output voltage such that, as the first output voltage changes, the second level signal changes by a corresponding amount; and
    a second level control circuit for varying the first output voltage based on the change in the second level signal.

5. A small amplitude signal output circuit as defined in claim 4, wherein said second level sense circuit decreases the second level signal in response to a fall in the first output voltage.

6. A small amplitude signal output circuit as defined in claim 4, wherein said second level sense circuit increases the second level signal in response to a rise in the first output voltage.

7. A small amplitude signal output circuit comprising:
- a first output section for receiving a first logic signal to output a first output signal having a first output voltage through a first output terminal;
- a first level sense circuit for producing a first level signal based on the first output voltage such that, as the first output voltage changes, the first level signal changes by a corresponding amount; and
- a first level control circuit for varying the first output voltage based on the change in the first level signal,
- wherein said first output section comprises a pair of first and second transistors connected in series, drain regions of said transistors being connected to said first output terminal and to a terminal voltage source through a resistor and said first output terminal,
- wherein said first level sense circuit comprises a third transistor having a gate connected to said first output terminal and a fourth transistor connected in series with said third transistor, and
- wherein said first level control circuit comprises a resistor element connected in series with said third and fourth transistors, and a bipolar transistor having an emitter connected to a source of said first transistor and a base connected to a drain of said third transistor.

8. A small amplitude signal output circuit as defined in claim 7, wherein said first level sense circuit decreases the first level signal in response to a fall in the first output voltage.

9. A small amplitude signal output circuit as defined in claim 7, wherein said first level sense circuit increases the first level signal in response to a rise in the first output voltage.

10. A small amplitude signal output circuit comprising:
- a first output section for receiving a first logic signal to output a first output signal having a first output voltage through a first output terminal;
- a first level sense circuit for producing a first level signal based on the first output voltage such that, as the first output voltage changes, the first level signal changes by a corresponding amount;
- a second output section for receiving a second logic signal to output a second output signal having a second output voltage through a second output terminal;
- a second level sense circuit for producing a second level signal based on the second output voltage such that, as the second output voltage changes, the second level signal changes by a corresponding amount; and
- a level control circuit for varying the first and second output voltages based on the changes in the first and second level signals, respectively.

11. A small amplitude signal output circuit as defined in claim 10, wherein said first level sense circuit increases the first level signal in response to a rise in the first output voltage.

12. A small amplitude signal output circuit as defined in claim 10, wherein said first level sense circuit decreases the first level signal in response to a fall in the first output voltage.

13. A small amplitude signal output circuit as defined in claim 10, wherein said second level sense circuit decreases the second level signal in response to a fall in the first output voltage.

14. A small amplitude signal output circuit as defined in claim 10, wherein said second level sense circuit increases the second level signal in response to a rise in the first output voltage.

* * * * *